(12) United States Patent
Kim

(10) Patent No.: US 9,013,210 B2
(45) Date of Patent: Apr. 21, 2015

(54) SEMICONDUCTOR INTEGRATED CIRCUIT

(71) Applicant: SK Hynix Inc., Gyeonggi-do (KR)

(72) Inventor: Jee Yul Kim, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/075,874

(22) Filed: Nov. 8, 2013

(65) Prior Publication Data

US 2015/0008959 A1    Jan. 8, 2015

(30) Foreign Application Priority Data

Jul. 8, 2013   (KR) .................. 10-2013-0079627

(51) Int. Cl.
*H03K 19/20*          (2006.01)
(52) U.S. Cl.
CPC .................................. *H03K 19/20* (2013.01)
(58) Field of Classification Search
USPC ............ 326/104, 40, 41, 44, 46, 49; 327/407, 327/408
See application file for complete search history.

(56) References Cited

U.S. PATENT DOCUMENTS 5,365,125 A * 11/1994 Goetting et al. ................. 326/39
8,502,555 B1 *  8/2013 Peterson et al. ................. 326/8

FOREIGN PATENT DOCUMENTS

KR    1019990030234    4/1999
KR    100790823    1/2008

* cited by examiner

*Primary Examiner* — Daniel D Chang
(74) *Attorney, Agent, or Firm* — IP & T Group LLP

(57) ABSTRACT

A semiconductor integrated circuit may include a plurality of fuse boxes, each suitable for selectively outputting a first input signal and a reverse input signal obtained by inverting the first input signal; and a first output signal generator suitable for selectively receiving the first input signal and the reverse input signal from the fuse boxes, and generating a first output signal by performing a logical combination operation on the received input signals, a second input signal, and a third input signal.

11 Claims, 11 Drawing Sheets

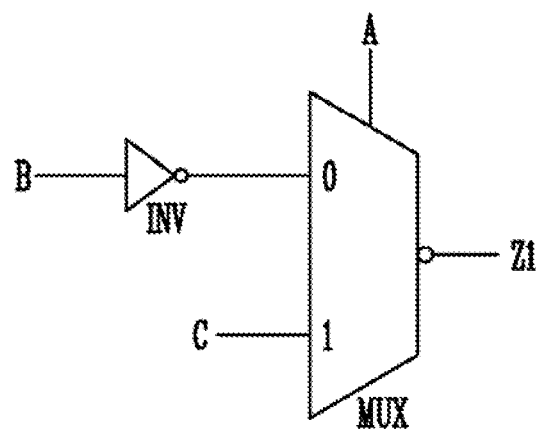

SEMICONDUCTOR INTEGRATED CIRCUIT

CROSS-REFERENCE TO RELATED APPLICATION

The present application claims priority to Korean patent application number 10-2013-0079627 filed on Jul. 8, 2013, in the Korean Intellectual Property Office, the entire disclosure of which is incorporated by reference herein.

BACKGROUND

1. Technical Field

Various exemplary embodiments relate to a semiconductor integrated circuit, and more particularly, to a semiconductor integrated circuit including a logic gate capable of implementing various functions.

2. Related Art

Most of the semiconductor integrated circuits include a plurality of logic gates to output signals for various functions based on a plurality of signals input from an external or internal circuit.

An AND gate, an OR gate, a NAND gate, a NOR gate, which are general logic gates, may output signals having logic levels changed in response to a logic level of an input signal, and circuits performing various functions may be implemented by combining a plurality of logic gates.

BRIEF SUMMARY

Various exemplary embodiments are directed to a semiconductor integrated circuit including a logic gate capable of implementing various functions.

An exemplary embodiment of the present invention provides a semiconductor integrated circuit including: a plurality of fuse boxes, each suitable for selectively outputting a first input signal and a reverse input signal obtained by inverting the first input signal; and a first output signal generator suitable for selectively receiving the first input signal and the reverse input signal from the fuse boxes, and generating a first output signal by performing a logical combination operation on the received input signals, a second input signal, and a third input signal.

An exemplary embodiment of the present invention provides a semiconductor integrated circuit including: a plurality of fuse boxes, each suitable for selectively outputting a first input signal and a reverse input signal obtained by inverting the first input signal; and a first output signal generator suitable for performing a logical combination operation on the received input signals from the plurality of fuse boxes, a second input signal and a third input signal to generate a first output signal; and a second output signal generator suitable for selectively receiving the first output signal, the second input signal, or a fourth input signal to generate a second output signal.

An exemplary embodiment of the present invention provides a semiconductor integrated circuit including: a plurality of fuse boxes, each suitable for selectively outputting a first input signal and a reverse input signal obtained by inverting the first input signal; and a first output signal generator suitable for performing a logical combination operation on the received input signals from the plurality of fuse boxes, a second input signal, and a third input signal to generate a first output signal; and a second output signal generator suitable for selectively receiving the first output signal, the second input signal, or a fourth input signal to generate a second output signal, wherein the logical combination operation includes any one of an inverter operation, a buffer operation, a NOR gate operation, a NAND gate operation, an OR gate operation, an AND gate operation, and a multiplexer operation on the first to third input signals based on connections of the plurality of fuse boxes.

According to an exemplary embodiment of the present invention, a semiconductor integrated circuit implements a logic gate capable of implementing various functions by selectively receiving an input signal or a reverse input signal by using the fuse boxes so that it is possible to easily design the semiconductor integrated circuit, and implement a logic gate capable of performing various functions by adjusting connections of the fuse boxes in the logic gate.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

The above and other features and advantages of the present invention will become more apparent to those of ordinary skill in the art by describing in detail embodiments thereof with reference to the attached drawings in which:

FIG. 12 is a diagram illustrating a function of a logic circuit according to the embodiment of the present invention.

DETAILED DESCRIPTION

Figure 1:
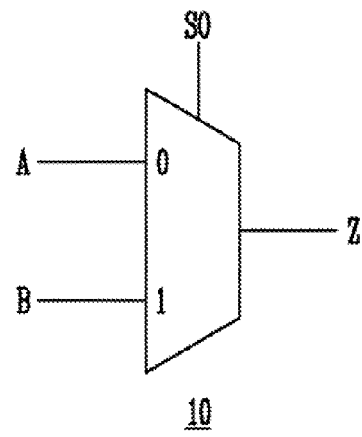
FIG. 1 is a block diagram illustrating a logic circuit of a semiconductor integrated circuit.

Hereinafter, an embodiment of the present invention will be described with reference to the accompanying drawings in detail. However, the present invention is not limited to an embodiment disclosed below and may be implemented in various forms and the scope of the present invention is not limited to the following embodiments. Rather, the embodiment is provided to more sincerely and fully disclose the present invention and to completely transfer the spirit of the present invention to those skilled in the art to which the present invention pertains, and the scope of the present invention should be understood by the claims of the present invention. Throughout the disclosure, reference numerals correspond directly to the like parts in the various figures and embodiments of the present invention.

The drawings are not necessarily to scale and in some instances, proportions may have been exaggerated in order to clearly illustrate features of the embodiments.

In this disclosure, when one part is referred to as being 'connected' to another part, it should be understood that the former can be 'directly connected' to the latter, or 'electrically connected' to the latter via an intervening part. Furthermore, when it is described that one comprises, includes or has some elements, it should be understood that it may comprise, include or have only those elements, or it may comprise, include or have other elements as well as those elements if there is no specific limitation. The terms of a singular for may include plural forms unless referred to the contrary.

FIG. 1 is a block diagram illustrating a logic circuit of a semiconductor integrated circuit.

Referring to FIG. 1, the logic circuit 10 includes a multiplexer in which a first input signal A is input to a positive input terminal '0', a second input signal B is input to a negative input terminal '1' and an output signal Z has a logic level changed in response to a logic level of a selection signal SO.

Figure 2:
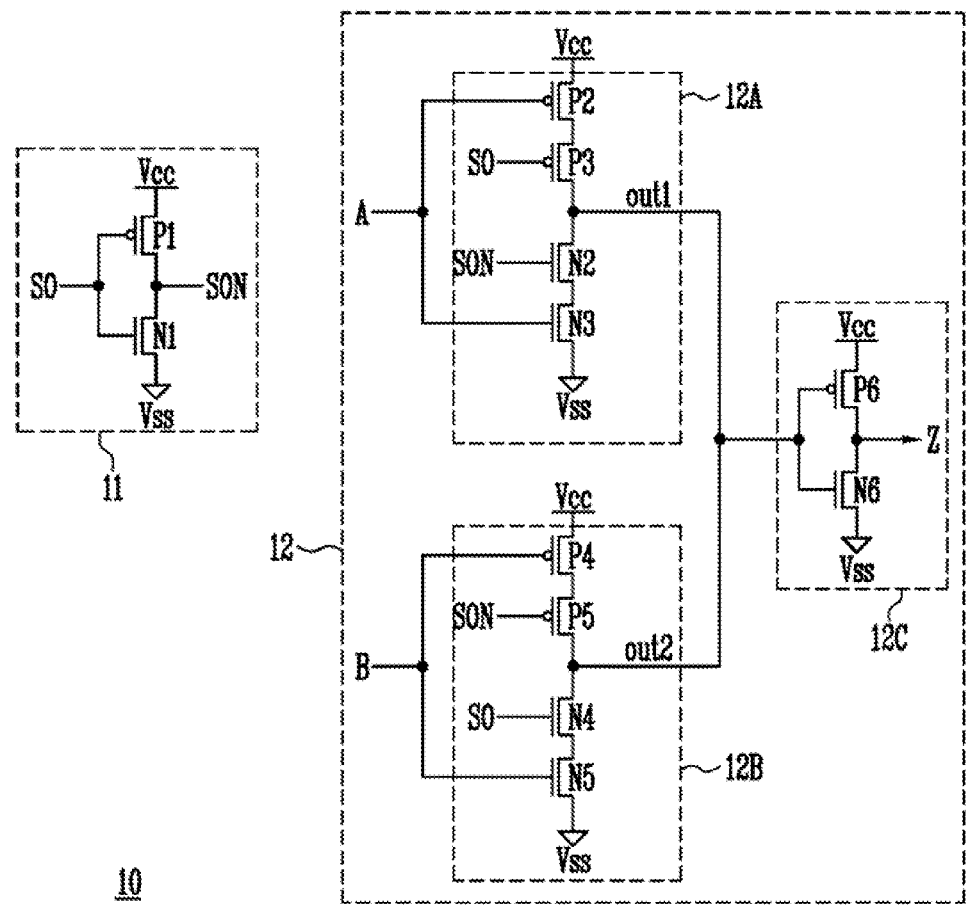
FIG. 2 is a detailed circuit diagram of the logic circuit shown in FIG. 1.

FIG. 2 is a detailed circuit diagram of the logic circuit of FIG. 1.

Referring to FIG. 2, the logic circuit 10 includes a reverse signal generator 11 and an output signal generator 12.

The reverse signal generator 11 generates a reverse selection signal SON by inverting the logic level of the selection signal SO.

The reverse signal generator 11 includes a PMOS transistor P1 and an NMOS transistor N1 serially connected between a power voltage (Vcc) terminal and a ground voltage (Vss) terminal. The selection signal SO is input to gates of the PMOS transistor P1 and the NMOS transistor N1, and the reverse selection signal SON is output through a node between the PMOS transistor P1 and the NMOS transistor N1. When the logic level of the selection signal SO is a low level, since the PMOS transistor P1 is turned on, the reverse signal generator 11 outputs the reverse selection signal SON having a high logic level, and when the logic level of the selection signal SO is a high level, since the NMOS transistor N1 is turned on, the reverse signal generator 11 outputs the reverse selection signal SON having a low logic level.

The output signal generator 12 generates the output signal Z having the logic level substantially the sane as a logic level of one of the first input signal A and the second input signal B in response to the selection signal SO and the reverse selection signal SON.

The output signal generator 12 includes a first signal generator 12A, a second signal generator 12B, and a reverse output unit 12C.

The first signal generator 12A includes PMOS transistors P2 and P3 and NMOS transistors N2 and N3 serially connected between the power voltage (Vcc) terminal and the ground voltage (Vss) terminal. The first input signal A is input to gates of the PMOS transistor P2 and the NMOS transistor N3, the selection signal SO is input to a gate of the PMOS transistor P3, and the reverse selection signal SON is input to a gate of the NMOS transistor N2. Accordingly, the first signal generator 12A floats a node between the PMOS transistor P2 and the NMOS transistor N2, or outputs a first output signal out1 having a logic level opposite to the logic level of the first input signal A, in response to the logic levels of the selection signal SO and the reverse selection signal SON.

The second signal generator 12B includes PMOS transistors P4 and P5 and NMOS transistors N4 and N5 serially connected between the power voltage (Vcc) terminal and the ground voltage (Vss) terminal. The second input signal B is input to gates of the PMOS transistor P4 and the NMOS transistor N5, the reverse selection signal SON is input to a gate of the PMOS transistor P5, and the selection signal SO is input to a gate of the NMOS transistor N4. Accordingly, the second signal generator 12B floats a node between the PMOS transistor P5 and the NMOS transistor N4, or outputs a second output signal out2 having a logic level opposite to the logic level of the second input signal B, in response to the logic level of the selection signal SO and the reverse selection signal SON.

The aforementioned first signal generator 12A and second signal generator 12B output the first output signal out1 or the second output signal out2 in response to the selection signal SO and the reverse selection signal SON.

The reverse output unit 12C includes a PMOS transistor P6 and an NMOS transistor N6 serially connected between the power voltage (Vcc) terminal and the ground voltage (Vss) terminal. The first output signal out1 or the second output signal out2 is input to gates of the PMOS transistor P6 and the NMOS transistor N6, and the output signal obtained by inverting the logic level of the first output signal out1 and the second output signal out2 is output through a node between the PMOS transistor P6 and the NMOS transistor N6.

The aforementioned logic circuit 10 performs only one logic function because the input signals A, B, SO, and SON are directly input to the logic circuit. Accordingly, in order to implement various functions, a plurality of logic circuits needs to be provided, and one logic function may be implemented by connecting the plurality of logic circuits.

Figure 3:
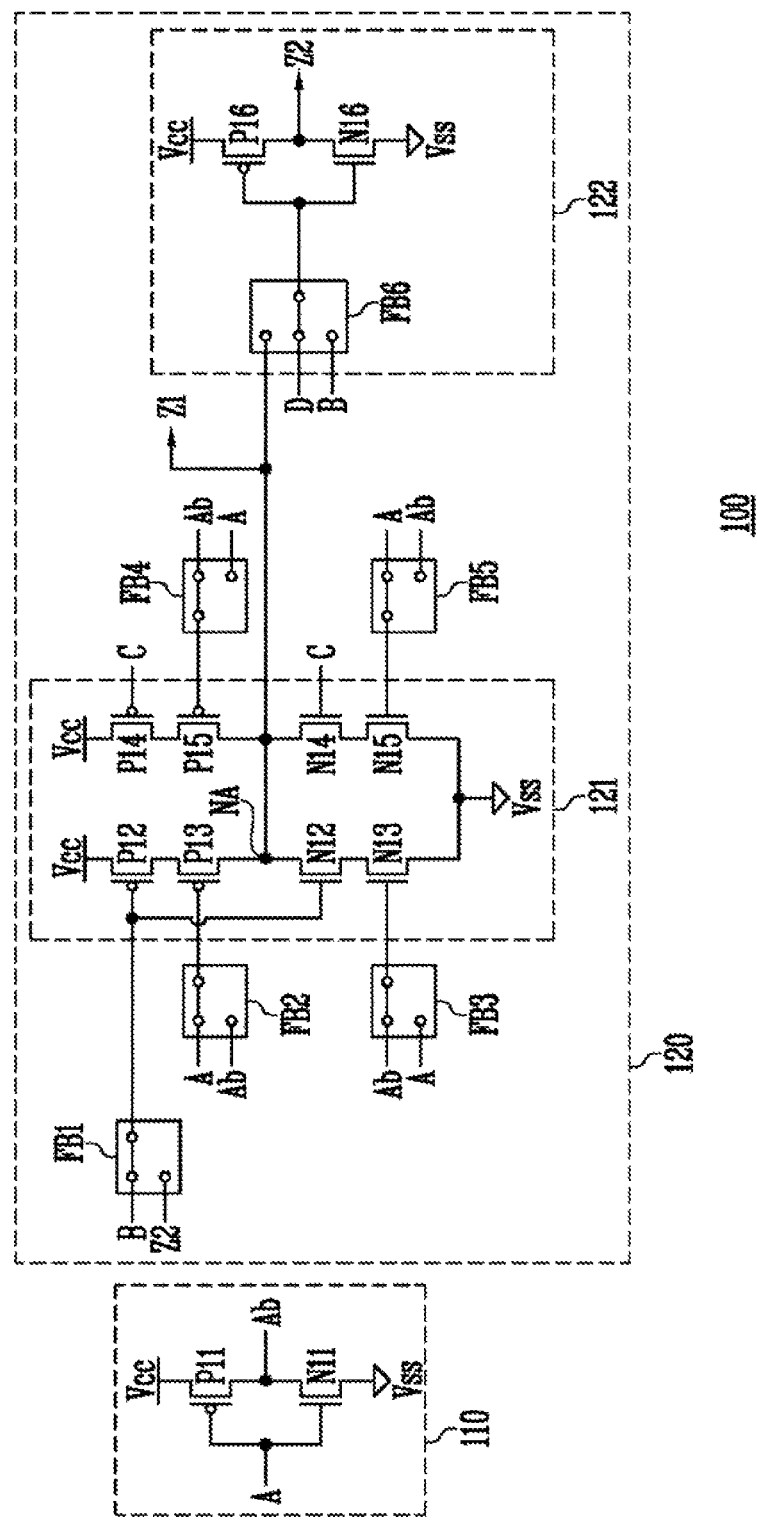
FIG. 3 is a circuit diagram illustrating a semiconductor integrated circuit according to an embodiment of the present invention.
Figure 4A:
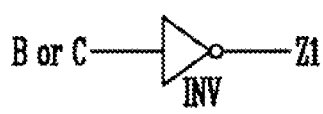
FIGS. 4A to 4D are diagrams illustrating functions of a logic circuit according to the embodiment of the present invention.
Figure 4A:
Figure 4B:
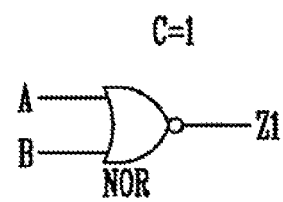
Figure 4B:
Figure 4C:
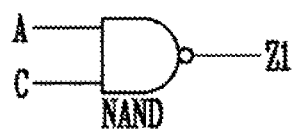
Figure 4C:
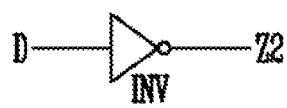
Figure 4D:
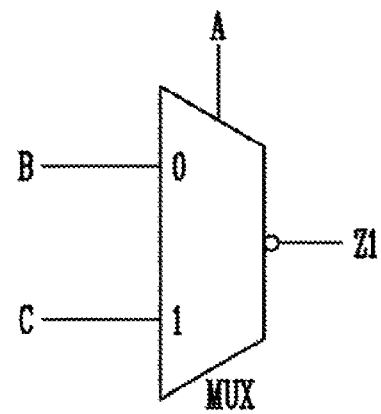
Figure 4D:
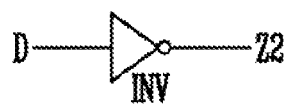

FIG. 3 is a circuit diagram of a semiconductor integrated circuit according to a first embodiment of the present invention.

Referring to FIG. 3, the semiconductor integrated circuit 100 includes a reverse signal generator 110 and a logic gate circuit 120.

The reverse signal generator 110 generates a first reverse input signal Ab by inverting a logic level of a first input signal A.

The reverse signal generator 110 includes a PMOS transistor P11 and an NMOS transistor N11 serially coupled between a power voltage (Vcc) terminal and a ground voltage (Vss) terminal. The first input signal A is input to gates of the PMOS transistor P11 and the NMOS transistor N11, and the first reverse input signal Ab is output through a node between the PMOS transistor P11 and the NMOS transistor N11. When the logic level of the first input signal A is a low level since the PMOS transistor P11 is turned on, the reverse signal generator 110 outputs the first reverse input signal Ab having a high logic level, and when the logic level of the first input signal A is a high level, since the NMOS transistor N11 is turned on, the reverse signal generator 11 outputs the first reverse input signal Ab having a low logic level.

The logic gate circuit 120 includes a plurality of fuse boxes FB1 to FB5, a first output signal generator 121, and a second output signal generator 122.

The first fuse box FB1 selectively applies one of a second input signal B and a second output signal Z2 to the first output signal generator 121. In the first embodiment of the present invention, the first fuse box FB1 is set to apply the second input signal B to the first output signal generator 121.

The second to fifth fuse boxes FB2 to FB5 selectively applies one of the first input signal A and the first inverse input signal Ab generated by the reverse signal generator 110 to the first output signal generator 121. In the first embodiment of the present invention, the second fuse box FB2 and the fifth fuse box FB5 are set to apply the first input signal A to the first output signal generator 121, and the third fuse box FB3 and the fourth fuse box FB4 are set to apply the first reverse input signal Ab to the first output signal generator 121.

The first output signal generator 121 includes a plurality of PMOS transistors P12 to P15, and a plurality of NMOS transistors N12 to N15. The PMOS transistors P12 and P13 and the NMOS transistors N12 and N13 are serially coupled between the power voltage (Vcc) terminal and the ground voltage (Vss) terminal, and the PMOS transistors P14 and P15 and the NMOS transistors N14 and N15 are serially coupled between the power voltage (Vcc) terminal and the ground voltage (Vss) terminal. A signal output from the first fuse box FB1 is applied to gates of the PMOS transistor P12 and the NMOS transistor N12. A signal output from the second fuse box FB2 is applied to a gate of the PMOS transistor P13. A signal output from the third fuse box FB3 is applied to a gate of the NMOS transistor N13. A third input signal C is input to gates of the PMOS transistor P14 and the NMOS transistor N14, a signal output from the fourth fuse box FB4 is applied to a date of the PMOS transistor P15, and a signal output from the fifth fuse box FB5 is applied to a gate of the NMOS transistor N15.

A node NA between the PMOS transistor P13 and the NMOS transistor N12 is coupled to a node between the PMOS transistor P15 and the NMOS transistor N14, and a first output signal Z1 is output through the node NA.

That is, the first output signal generator 121 outputs the first output signal Z1 in response to the signals output from the first to fifth fuse boxes FB1 to FB5 and the third input signal C.

The second output signal generator 122 includes a sixth fuse box FB6, a PMOS transistor P16, and an NMOS transistor N16.

The sixth fuse box FP6 selects and outputs one of the first output signal Z1 the second input signal B, and a fourth input signal D.

The PMOS transistor P16 and the NMOS transistor N16 are serially coupled between the power voltage (Vcc) terminal and the ground voltage (Vss) terminal an output signal output from the sixth fuse box FB6 is input to gates of the PMOS transistor P16 and the NMOS transistor N16, and the second output signal Z2 obtained by inverting the output signal of the sixth fuse box FB6 is output through a node between the PMOS transistor P16 and the NMOS transistor N16. In the first embodiment of the present invention, the sixth fuse box FB6 is set to apply the fourth input signal D to the second output signal generator 122.

FIGS. 4A to 4D are diagrams illustrating functions of the logic circuit according to the first embodiment of the present invention.

Table 1 represents the functions of the logic circuit illustrated in FIGS. 4A to 4D.

TABLE 1

|   | Inverter (type1) | Inverter (type2) | NOR gate | NAND gate | Multiplexer |
|---|---|---|---|---|---|
| A | 0 | 1 | input | input | sel |
| B | input | — | input | 0 | when sel=0 |
| C | — | input | 1 | input | when sel=1 |
| Function | Z1≤not(B) | Z1≤not(C) | Z1≤A nor B | Z1≤A nand C | if sel=0 then Z1≤not(B) else Z1≤not(C) |
| Option |  |  | Z2≤not(D) |  |  |

An operation of the semiconductor integrated circuit according to the first embodiment of the present invention will be described with reference to FIGS. 3, 4A to 4D, and Table 1.

1) Inverter Operation (Type1 and Type2)

The inverter operation outputting an input signal by inverting a logic level of the input signal may perform a first type (type1) inverter operation inverting the second input signal B, and a second type (type2) inverter operation inverting the third input signal C.

In a case of the first type (type1) inverter operation, the first input signal A is set to a low logic level, and the third input signal C is set to be in a floating state.

The reverse signal generator 110 generates the first reverse input signal Ab of a high logic level in response to the first input signal A of the low logic level.

The PMOS transistor P13 of the first output signal generator 121 is turned on in response to the first input signal A, and the NMOS transistor N13 is turned on in response to the first reverse input signal Ab. Accordingly, when the input signal B has the high logic level, since the output signal of the first fuse box FB1 has the high logic level and the NMOS transistor N12 is turned on, the first output signal Z1 of the low level is output through the node NA. When the second input signal is the low logic level, since the output signal of the first fuse box FB1 has the low logic level and the PMOS transistor P12 is turned on, the first output signal Z1 of the high level is output through the node NA. Accordingly, the first output signal generator 121 may perform the first type (type1) inverter operation of outputting the first output signal Z1 by inverting the second input signal B.

In a case of the second type (type2) inverter operation, the first input signal A is set to be a high logic level, and the second input signal B is set to be in a floating state.

The reverse signal generator 110 generates the first reverse input signal Ab of a low logic level in response to the first input signal A of the high logic level.

The PMOS transistor P15 of the first output signal generator 121 is turned on in response to the first reverse input signal Ab, and the NMOS transistor N15 is turned on in response to the first input signal A. Accordingly, when the third input signal C has the high logic level, the first output signal Z1 of the low level is output through the node NA since the NMOS transistor N14 is turned on. When the third input signal C has the low logic level, the first output signal Z1 of the high level is output through the node NA since the PMOS transistor P14 is turned on. Accordingly, the first output signal generator 121 may perform the second type (type2) inverter operation of outputting the first output signal Z1 by inverting the third input signal C.

Further, the second output signal generator 122 may generate the second output signal Z2 by inverting the third input signal D.

2) NOR Gate Operation

When a NOR gate operation is performed, the third input signal C is set to be the high logic level.

When both the first input signal A and the second input signal B is have the low logic level, since the PMOS transistors P12 and P13 are turned on, the first output signal Z1 of the high level is output through the node NA. When the first input signal A has the low logic level and the second input signal B has the high logic level, since the NMOS transistors N12 and N13 are turned on, the first output signal Z1 of the low level is output through the node NA. When the first input signal A has the high logic level and the second input signal B has the low logic level, since the NMOS transistors N14 and N15 are turned on, the first output signal Z1 of the low level is output through the node NA. When both the first input signal A and the second input signal B have the high logic level, since the NMOS transistors N14 and N15 are turned on, the first output signal Z1 of the low level is output through the node NA. Accordingly, the first output signal generator 121 may perform the NOR gate operation on the first input signal A and the second input signal B to output the first output signal Z1.

Further, the second output signal generator 122 may generate the second output signal Z2 by inverting the third input signal D.

3) NAND Gate Operation

When a NAND gate operation is performed, the second input signal B is set to be the low logic level.

When both the first input signal A and the third input signal C have the low level, since the PMOS transistors P12 and P13 are turned on, the first output signal Z1 of the high level is output through the node NA. When the first input signal A has the low logic level and the third input signal C has the high logic level, since the PMOS transistors P12 and P13 are turned on, the first output signal Z1 of the high level is output through the node NA. When the first input signal A has the high logic level and the third input signal C has the low logic level, since the PMOS transistors P14 and P15 are turned on, the first output signal Z1 of the high level is output through the node NA. When both the first input signal A and the third input signal C have the high logic level, since the NMOS transistors N14 and N15 are turned on, the first output signal Z1 of the low level is output through the node NA. Accordingly, the first output signal generator 121 may perform the NAND gate operation on the first input signal A and the third input signal C to output the first output signal Z1.

Further, the second output signal generator 122 may generate the second output signal Z2 by inverting the third input signal D.

4) Multiplexer Operation

When a multiplexer operation is performed, the first output signal generator 121 may output the first output signal Z1 by inverting the second input signal B or the third input signal C in response to the logic level of the first input signal A.

When the first input signal A is the low logic level, the PMOS transistor P12 or the NMOS transistor N12 is turned on in response to the logic level of the second input signal B in a state that the PMOS transistor P13 and the NMOS transistor N13 are turned on. That is, the logic level of the node NA is changed into the high or low level in response to the logic level of the second input signal B. Accordingly, the first output signal Z1 having the logic level opposite to the logic level of the second input signal B is output.

When the first input signal A is the high logic level, the PMOS transistor P14 or the NMOS transistor N14 is turned on in response to the logic level of the third input signal C in a state that the PMOS transistor P15 and the NMOS transistor N15 are turned on. That is, the logic level of the node NA is changed into the high or low level in response to the logic level of the third input signal C. Accordingly, the first output signal Z1 having the logic level opposite to the logic level of the third input signal C is output.

Accordingly, the first output signal generator 121 may perform the multiplexer operation based on the second input signal B and the third input signal C in response to the first input signal A, and output the first output signal Z1 whose logic level is opposite to the second input signal B or the third input signal C.

Further, the second output signal generator 122 may generate the second output signal Z2 by inverting the third input signal D.

Figure 5:
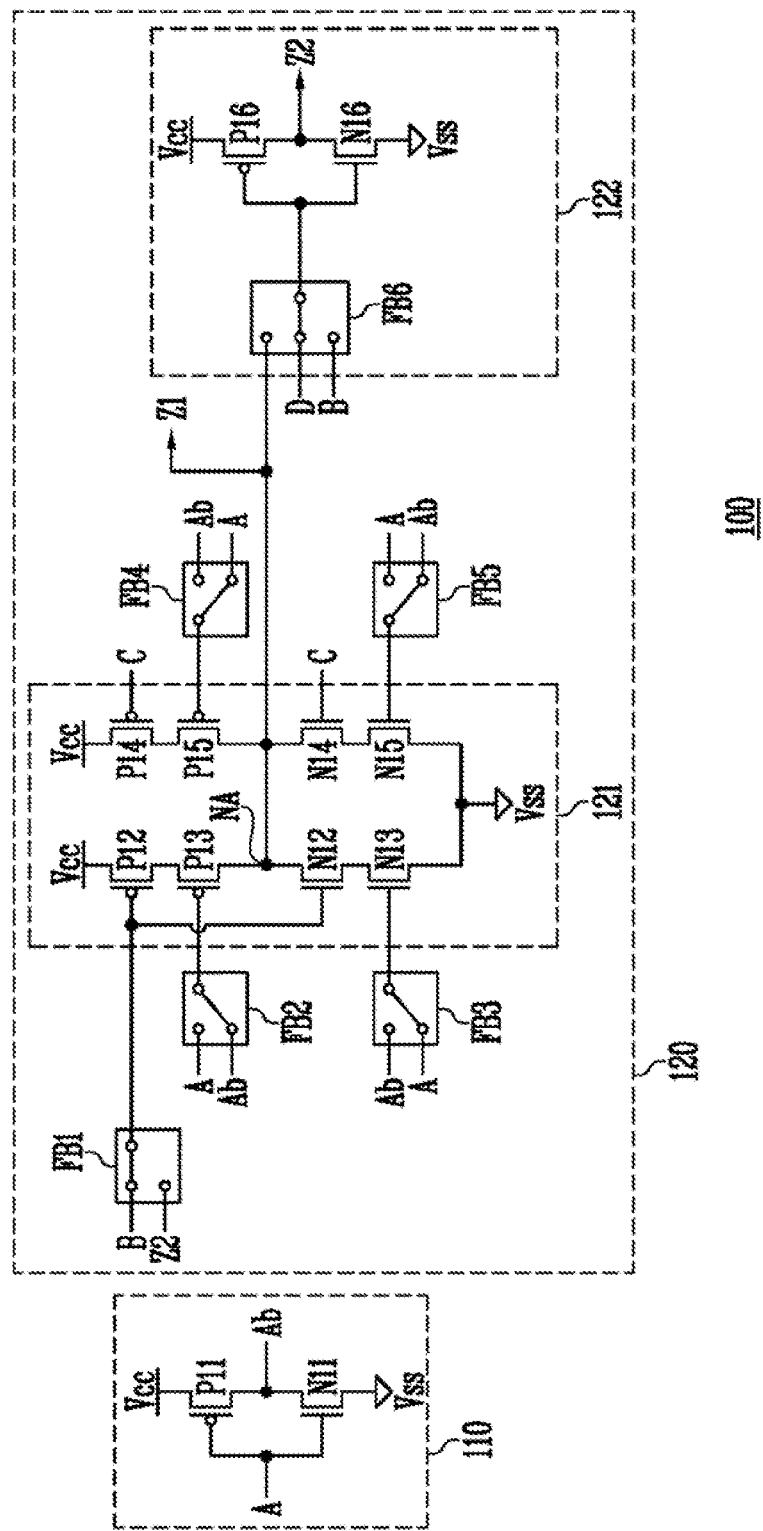
FIG. 5 is a circuit diagram illustrating a semiconductor integrated circuit according to an embodiment of the present invention.

FIG. 5 is a circuit diagram of a semiconductor integrated circuit according to a second embodiment of the present invention.

Referring to FIG. 5, the semiconductor integrated circuit 100 according to the second embodiment of the present invention has substantially the same circuit configuration as that of the first embodiment, but has a different connection relation of fuse boxes from that of the second embodiment.

In the second embodiment of the present invention, a first fuse box FB1 is set to apply a second input signal B to the first output signal generator 121, a second fuse box FB2 and a fifth fuse box FB5 are set to apply a first reverse input signal Ab to the first output signal generator 121, and a third fuse box FB3 and a fourth fuse box FB4 are set to apply a first input signal A to the first output signal generator 121.

Figure 6A:
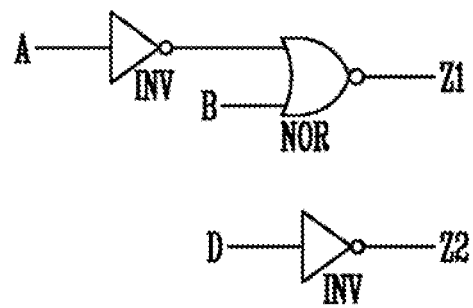
FIGS. 6A to 6B are diagrams illustrating functions of a logic circuit according to the embodiment of the present invention.
Figure 6B:
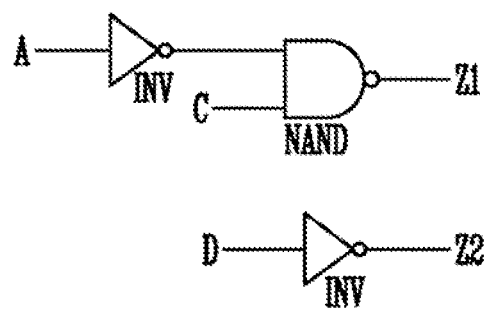

FIGS. 6A to 6B are diagrams illustrating functions of a logic circuit according to the second embodiment of the present invention.

Table 2 represents functions of the logic circuit illustrated in FIGS. 6A to 6B.

TABLE 2

|  | NOR gate | NAND gate |
| --- | --- | --- |
| A | input | input |
| B | input | 0 |
| C | 1 | input |
| Function | Z1≤not(A) nor B | Z1≤not(A) nand c |
| Option |  | Z2≤not(D) |

An operation of the semiconductor integrated circuit according to the second embodiment of the present invention will be described with reference to FIGS. 5, 6A to 6B, and Table 2.

1) NOR Gate Operation

When a NOR gate operation on an inverted signal of the first input signal A, i.e., the first reverse input signal Ab, and the second input signal B is performed, a third input signal C is set to be a high logic level.

When both the first input signal A and the second input signal B have a low logic level, since the NMOS transistors N14 and N15 are turned on, the first output signal Z1 of the low level is output through the node NA. When the first input signal A has the low logic level and the second input signal B has the high logic level, since the NMOS transistors N14 and N15 are turned on, the first output signal Z1 of the low level is output through the node NA. When the first input signal A has the high logic level and the second input signal B has the low logic level, since the PMS transistors P12 and P13 are turned on, the first output signal Z1 of the high level is output through the node NA. When both the first input signal A and the second input signal B have the high logic level, since the NMOS transistors N12 and N13 are turned on, the first output signal Z1 of the low level is output through the node NA. Accordingly, the first output signal generator 121 may perform the NOR gate operation on the inverted signal of the first input signal A and the second input signal B to output the first output signal Z1.

Further, the second output signal generator 122 may generate the second output signal Z2 by inverting the third input signal D.

2) NAND Gate Operation

When a NAND gate operation on the inverted signal of the first input signal A, i.e., the first reverse input signal Ab, and the third input signal C is performed, the second input signal B is set to be a low logic level.

When both the first input signal A and the third input signal C have the low logic level, since the PMOS transistors P14 and P15 are turned on, the first output signal Z1 of the high level is output through the node NA. When the first input signal A has the low logic level and the third input signal C has the high logic level, since the NMOS transistors N14 and N15 are turned on, the first output signal Z1 of the low level is output through the node NA. When the first input signal A has the high logic level and the third input signal C has the low logic level, since the PMOS transistors P12 and P13 are turned on, the first output signal Z1 of the high level is output through the node NA. When both the first input signal A and the third input signal C have the high level, since the PMOS transistors P12 and P13 are turned on, the first output signal Z1 of the high level is output through the node NA. Accordingly, the first output signal generator 121 may perform the NAND gate operation on the inverted signal of the first input signal A and the third input signal C to output the first output signal Z1.

Further, the second output signal generator 122 may generate the second output signal Z2 by inverting the third input signal D.

Figure 7:
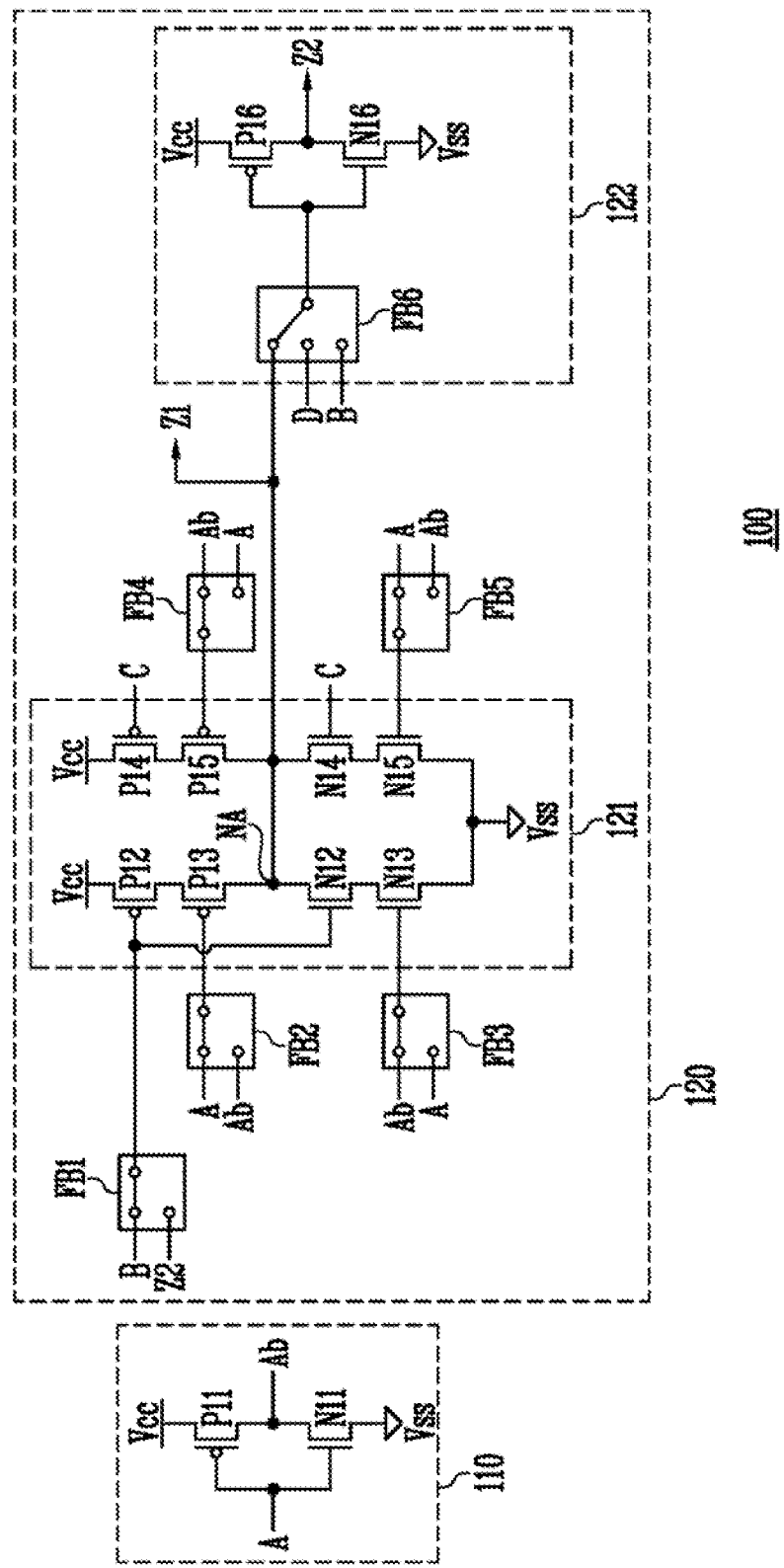
FIG. 7 is a circuit diagram illustrating a semiconductor integrated circuit according to an embodiment of the present invention.
Figure 8A:
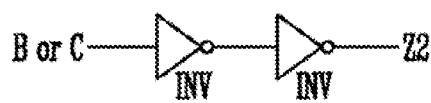
FIGS. 8A to 8D are diagrams illustrating functions of a logic circuit according to the embodiment of the present invention.
Figure 8B:
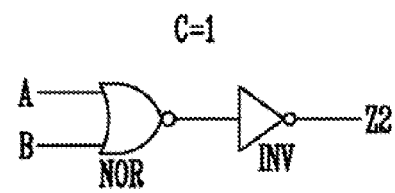
Figure 8C:
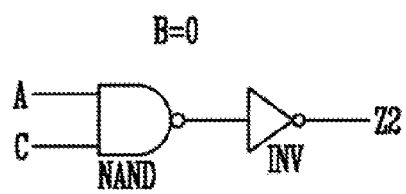
Figure 8D:
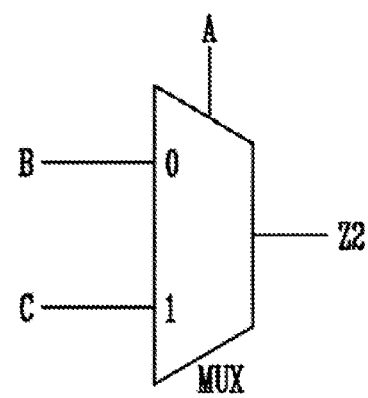

FIG. 7 is a circuit diagram of a semiconductor integrated circuit according to a third embodiment of the present invention.

Referring to FIG. 7, the semiconductor integrated circuit 100 according to the third embodiment of the present invention has substantially the same circuit configuration as that of the first embodiment, but has a different connection relation of fuse boxes from that of the third embodiment.

In the third embodiment of the present invention, a first fuse box FB1 is set to apply a second input signal B to the first output signal generator 121, a second fuse box FB2 and a fifth fuse be FB6 are set to apply a first input signal A to the first output signal generator 121, and a third fuse box FB3 and a fourth fuse box FB4 are set to apply a first reverse input signal Ab to the first output signal generator 121. Further, a sixth fuse box FB6 of the second output signal generator 122 is set to apply the first output signal Z1 to the PMOS transistor P16 and NMOS transistor N16.

FIGS. 8A to 8D are diagrams illustrating functions of a logic circuit according to the third embodiment of the present invention.

Table 3 represents functions of the logic circuit illustrated in FIGS. 8A to 8D.

TABLE 3

|  | Buffer (type1) | Buffer (type2) | OR gate | AND gate | Multiplexer |
|---|---|---|---|---|---|
| A | 0 | 1 | input | input | sel |
| B | input | — | input | 0 | when sel=0 |
| C | — | input | 1 | input | when sel=1 |
| Function | Z2≤B | Z2≤C | Z2≤A or B | Z2≤A and C | if sel=0 then Z2≤B else Z2≤C |

An operation of the semiconductor integrated circuit according to the third embodiment of the present invention will be described with reference to FIGS. 7, 8A to 8D, and Table 3.

1) Buffer Operation (Type1 and Type2)

The buffer operation buffering an input signal without changing a logic level of the input signal may perform a first type (type1) buffer operation buffering a second input signal B, and a second type (type2) buffer operation buffering a third input signal C.

In a case of the first type (type1) buffer operation, the first input signal A is set to be a low logic level, and the third input signal C is set to be in a floating state.

The reverse signal generator 110 generates the first reverse input signal Ab of a high logic level in response to the first input signal A of the low logic level.

The PMOS transistor P13 of the first output signal generator 121 is turned on in response to the first input signal A, and the NMOS transistor N13 is turned on in response to the first reverse input signal Ab. Accordingly, when the input signal B has the high logic level, since an output signal of a first fuse box FB1 has the high logic level and the NMOS transistor N12 is turned on, the first output signal Z1 of the love level is output through a node NA. When the second input signal B is the low logic level, since the output signal of the first fuse box FB1 has the low logic level and the PMOS transistor P12 is turned on, the first output signal Z1 of the high level is output through the node NA.

The second output signal generator 122 outputs a second output signal Z2 by inverting the first output signal Z1.

Accordingly, the semiconductor integrated circuit 100 may perform the first type (type1) buffer operation of outputting the second output signal Z2 by buffering the second input signal B.

In a case of the second type (type2) buffer operation, the first input signal A is set to be a high logic level, and the second input signal B is set to be in a floating state.

The reverse signal generator 110 generates the first reverse input signal Ab of a low logic level in response to the first input signal A of the high logic level.

A PMOS transistor P15 of the first output signal generator 121 is turned on in response to the first reverse input signal Ab, and an NMOS transistor N15 is turned on in response to the first input signal A. Accordingly, when the third input signal C has the high logic level, the first output signal Z1 of the low level is output through the node NA since the NMOS transistor N14 is turned on. When the third input signal C has the low logic level, the first output signal Z1 of the high level is output through the node NA since the PMOS transistor P14 is turned on.

The second output signal generator 122 outputs the second output signal Z2 by inverting the first output signal Z1.

Accordingly, the semiconductor integrated circuit 100 may perform the second type (type2) buffer operation of outputting the second output signal Z2 by buffering the third input signal C.

2) OR Gate Operation

When an OR gate operation is performed, the third input signal C is set to be the high logic level.

When both the first input signal A and the second input signal B have the low logic level, since the PMOS transistors P12 and P13 are turned on, the first output signal Z1 of the high level is output through the node NA. When the first input signal A has the low logic level and the second input signal B has the high logic level, since the NMOS transistors N12 and N13 are turned on, the first output signal Z1 of the low level is output through the node NA. When the first input signal A has the high logic level and the second input signal B has the low logic level, since the NMOS transistors N14 and N15 are turned on, the first output signal Z1 of the low level is output through the node NA. When both the first input signal A and the second input signal B have the high logic level, since the NMOS transistors N14 and N15 are turned on, the first output signal Z1 of the low level is output through the node NA.

The second output signal generator 122 outputs the second output signal Z2 by inverting the first output signal Z1.

Accordingly, the semiconductor integrated circuit 100 may perform the OR gate operation on the first input signal A and the second input signal B to output the second output signal Z2.

3) AND Gate Operation

When an AND gate operation is performed, the second input signal B is set to be the low logic level.

When both the first input signal A and the third input signal C have the low logic level, since the PMOS transistors P12 and P13 are turned on, the first output signal Z1 of the high level is output through the node NA. When the first input signal A has the low logic level and the third input signal C has the high logic level, since the PMOS transistors P12 and P13 are turned on, the first output signal Z1 of the high level is output through the node NA. When the first input signal A has the high logic level and the third input signal C has the low logic level, since the PMOS transistors P14 and P15 are turned on, the first output signal Z1 of the high level is output through the node NA. When both the first input signal A and the third input signal C have the high logic level since the NMOS transistors N14 and N15 are turned on, the first output signal Z1 of the low level is output through the node NA.

The second output signal generator 122 outputs the second output signal Z2 by inverting the first output signal Z1.

Accordingly, the semiconductor integrated circuit 100 may perform the AND gate operation on the first input signal A and the third input signal C to output the second output signal Z2.

4) Multiplexer Operation

When a multiplexer operation is performed, the semiconductor integrated circuit 100 may output the second output signal Z2 by selecting one of the second input signal B and the third input signal C.

When the first input signal A is the low logic level, the PMOS transistor P12 or the NMOS transistor N12 is turned on in response to the logic level of the second input signal B in a state that the PMOS transistor P13 and the NMOS transistor N13 are turned on. That is, the logic level of the node NA is changed into the high or low level in response to the logic level of the second input signal B. Accordingly, the first output signal Z1 having the logic level opposite to the logic level of the second input signal B is output. The second output signal generator 122 outputs the second output signal Z2 by inverting the first output signal Z1.

When the first input signal A is the high logic level, the PMOS transistor P14 or the NMOS transistor N14 is turned on in response to the logic level of the third input signal C in a state that the PMOS transistor P15 and the NMOS transistor N15 are turned on. That is, the logic level of the node NA is changed into the high or low level in response to the logic level of the third input signal C. Accordingly, the first output signal Z1 having the logic level opposite to the logic level of the third input signal C is output. The second output signal generator 122 outputs the second output signal Z2 by inverting the first output signal Z1.

Accordingly, the semiconductor integrated circuit 100 may perform the multiplexer operation based on the second input signal B and the third input signal C in response to the first input signal A, and output the second output signal Z2 whose logic level is substantially the same as the second input signal B or the third input signal C.

Figure 9:
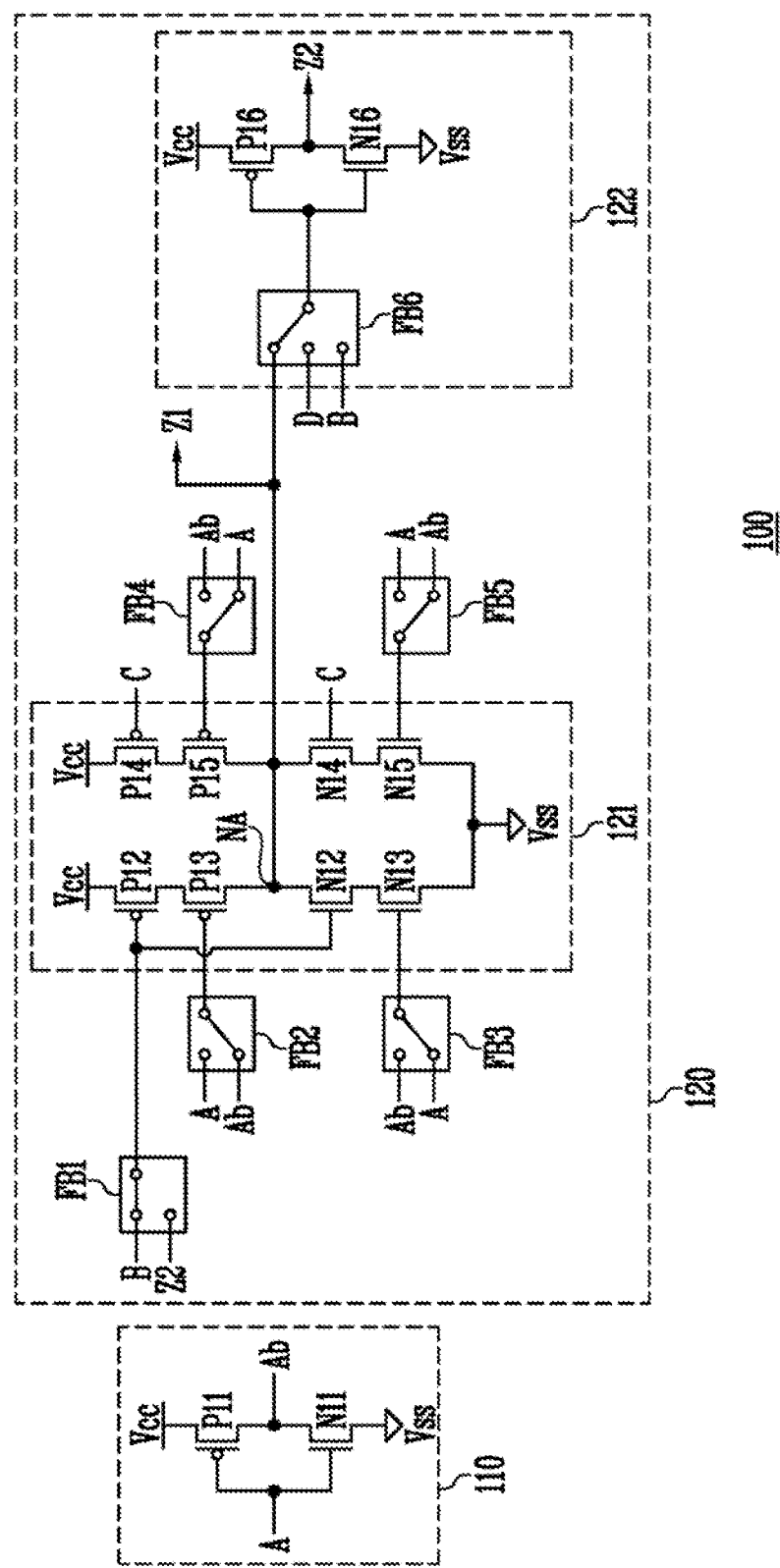
FIG. 9 is a circuit diagram illustrating a semiconductor integrated circuit according to an embodiment of the present invention.

FIG. 9 is a circuit diagram of a semiconductor integrated circuit according to a fourth embodiment of the present invention.

Referring to FIG. 9, the semiconductor integrated circuit 100 according to the fourth embodiment of the present invention has substantially the same circuit configuration as that of the first embodiment, but has a different connection relation of fuse boxes from that of the second embodiment.

In the fourth embodiment of the present invention a first fuse box FB1 is set to apply a second input signal B to the first output signal generator 121, a second fuse box FB2 and a fifth fuse box FB5 are set to apply a first reverse input signal Ab to the first output signal generator 121, and a third fuse box FB3 and a fourth fuse box FB4 are set to apply a first input signal A to the first output signal generator 121. Further, a sixth fuse box FB6 of the second output signal generator 122 is set to apply the first output signal Z1 to the second output signal generator 122.

Figure 10A:
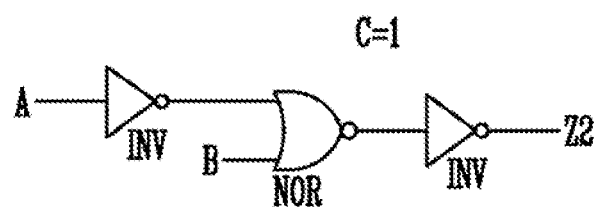
FIGS. 10A to 10B are diagrams illustrating functions of a logic circuit according to the embodiment of the present invention.
Figure 10B:
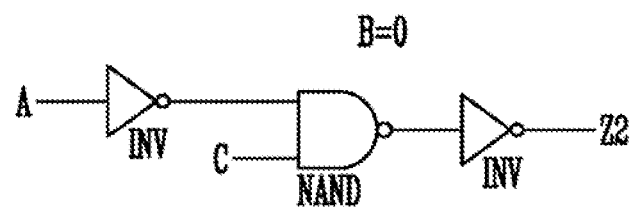

FIGS. 10A and 10B are diagrams illustrating functions of a logic circuit according to the fourth embodiment of the present invention.

Table 4 represents functions of the logic circuit illustrated in FIGS. 10A and 10D.

TABLE 4

| | OR gate | AND gate |
|---|---|---|
| A | input | input |
| B | input | 0 |
| C | 1 | input |
| Function | Z2≤not(A) or B | Z2≤not(A) and c |

An operation of the semiconductor integrated circuit according to the fourth embodiment of the present invention will be described with reference to FIGS. 9, 10A and 10B, and Table 4.

1) OR Gate Operation

When an OR gate operation on an inverted signal of the first input signal A, i.e., the first reverse input signal Ab, and the second input signal B is performed, a third input signal C is set to be a high logic level.

When both the first input signal A and the second input signal B have a low logic level, since the NMOS transistors N14 and N15 are turned on, the first output signal Z1 of the low level is output through the node NA. When the first input signal A has the low logic level and the second input signal B has the high logic level, since the NMOS transistors N14 and N15 are turned on, the first output signal Z1 of the low level is output through the node NA. When the first input signal A has the high logic level and the second input signal B has the low logic level, since the PMOS transistors P12 and P13 are turned on, the first output signal Z1 of the high level is output through the node NA. When both the first input signal A and the second input signal B have the high logic level, since the NMOS transistors N12 and N13 are turned on, the first output signal Z1 of the low level is output through the node NA. The second output signal generator 122 outputs the second output signal 72 by inverting the first output signal Z1. Accordingly, the semiconductor integrated circuit 100 may perform the OR gate operation on the inverted signal of the first input signal A and the second input signal B to output the second output signal Z2.

2) AND Gate Operation

When an AND gate operation on the inverted signal of the first input signal A, i.e., the first reverse input signal Ab, and the third input signal C is performed, the second input signal B is set to be a low logic level.

When both the first input signal A and the third input signal C have the low logic level, since the PMOS transistors P14 and P15 are turned on, the first output signal Z1 of the high level is output through the node NA. When the first input signal A has the low logic level and the third input signal C has the high logic level, since the NMOS transistors N14 and N15 are turned on, the first output signal Z1 of the low level is output through the node NA. When the first input signal A has the high logic level and the third input signal C has the low logic level, since the PMOS transistors P12 and P13 are turned on, the first output signal Z1 of the high level is output through the node NA. When both the first input signal A and the third input signal C have the high logic level, since the PMOS transistors P12 and P13 are turned on, the first output signal Z1 of the high level is output through the node NA. The second output signal generator 122 outputs the second output signal Z2 by inverting the first output signal Z1. Accordingly, the semiconductor integrated circuit 100 may perform the AND gate operation on the inverted signal of the first input signal A and the third input signal C to output the second output signal Z2.

Figure 11:
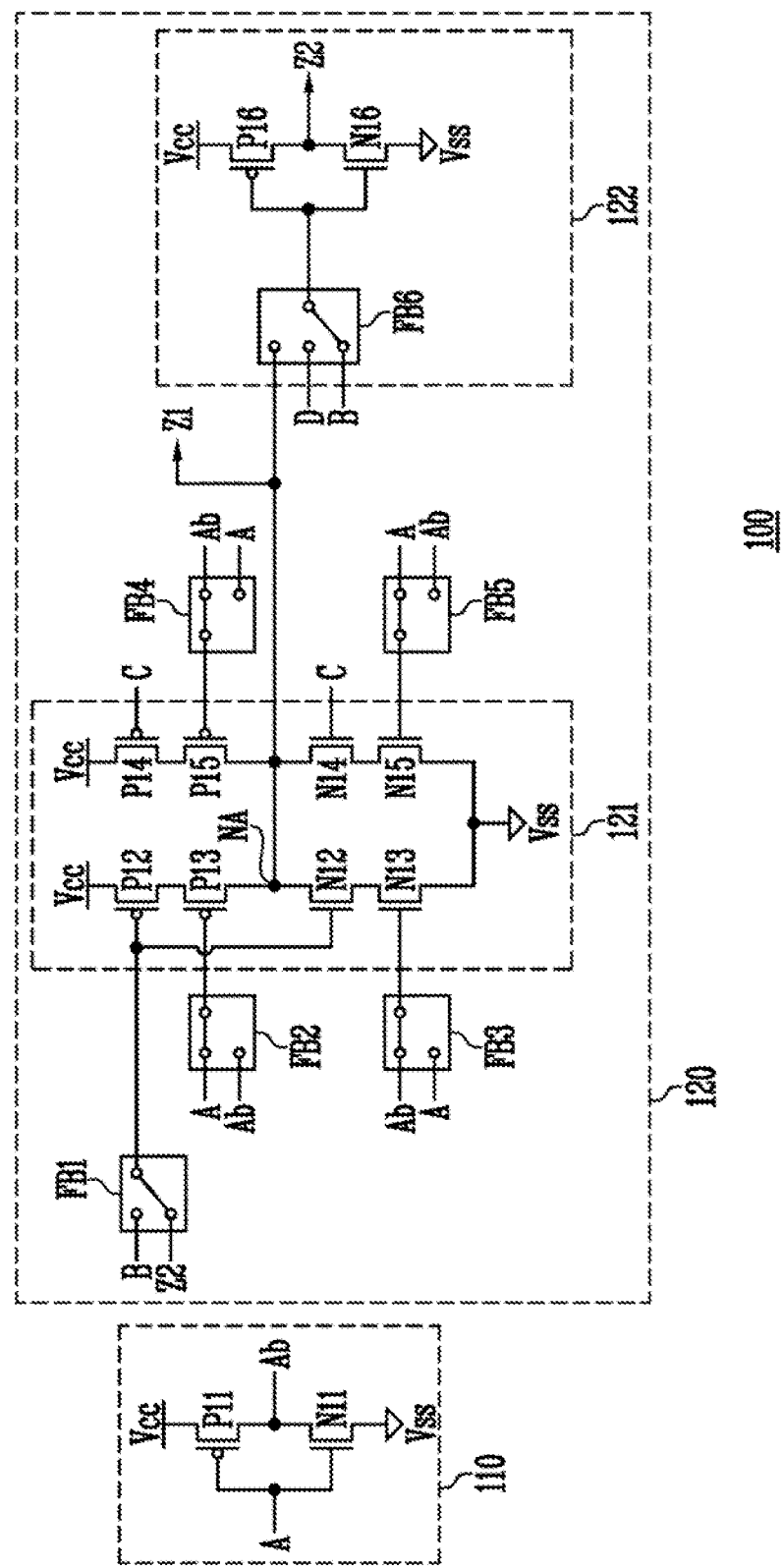
FIG. 11 is a circuit diagram illustrating a semiconductor integrated circuit according to an embodiment of the present invention.

FIG. 11 is a circuit diagram of a semiconductor integrated circuit according to a fifth embodiment of the present invention.

In the fifth embodiment of the present invention, a first fuse box FB1 is set to apply a second output signal Z2 to the first output signal generator 121, a second fuse box FB2 and a fifth fuse box FB5 are set to apply a first input signal A to the first output signal generator 121, and a third fuse box FB3 and a fourth fuse box FB4 are set to apply a first reverse input signal Ab to the first output signal generator 121. Further, a sixth fuse box FB6 of the second output signal generator 122 is set to apply the second input signal B to the first output signal generator 121.

FIG. 12 is a diagram illustrating functions of a logic circuit according to the fifth embodiment of the present invention.

Table 5 represents a function of the logic circuit illustrated in FIG. 12.

TABLE 5

| Multiplexer | |
|---|---|
| input A | sel |
| input B | when sel=0 |

TABLE 5-continued

| Multiplexer | |
|---|---|
| input C | when sel=1<br>if sel=0 then Z1≤B<br>else Z1≤not(C) |

An operation of the semiconductor integrated circuit according to the fifth embodiment of the present invention will be described with reference to FIGS. 11 and 12, and Table 5.

When a multiplexer operation is performed, the first output signal generator 121 may output the first output signal Z1 having a logic level substantially the same as that of the second input signal B, or opposite to a logic level of the third input signal C in response to the logic level of the first input signal A. The second output signal generator 122 outputs the second output signal Z2 by inverting the second input signal B.

When the first input signal A is the low logic level, the PMOS transistor P12 or the NMOS transistor N12 is turned on in response to the logic level of the second output signal Z2 in a state that the PMOS transistor P13 and the NMOS transistor N13 are turned on. That is, the logic level of the node NA is changed into the high or low level in response to the logic level of the second output signal Z2. Accordingly, the first output signal Z1 having the logic level substantially the same as that of the second input signal B is output.

When the first input signal A is the high logic level, the PMOS transistor P14 or the NMOS transistor N14 is turned on in response to the logic level of the third input signal C in a state that the PMOS transistor P15 and the NMOS transistor N15 are turned on. That is, the logic level of the node NA is changed into the high or low level in response to the logic level of the third input signal C. Accordingly, the first output signal Z1 having the logic level opposite to the logic level of the third input signal C is output.

According to the first to fifth embodiments of the present invention, it is possible to easily design a semiconductor integrated circuit, and implement a logic gate capable of performing various functions by adjusting connections of the fuse boxes in the logic gate. Further, it is possible to implement the logic gate capable of implementing various functions by selective receiving an input signal or a reverse input signal by using the fuse boxes.

While the preferred embodiments are implemented by way of illustrating a case where the input signals are selected by using the fuse boxes, the input signals may be selectively input to the first output signal generator and the second output signal generator by using a switch circuit.

As described above, the embodiment has been disclosed in the drawings and the specification. The specific terms used herein are for purposes of illustration, and do not limit the scope of the present invention defined in the claims. Accordingly, those skilled in the art will appreciate that various modifications and another equivalent example may be made without departing from the scope and spirit of the present disclosure. Therefore, the scope of the present invention will be defined by the technical spirit of the accompanying claims.

What is claimed is:
1. A semiconductor integrated circuit comprising:
a plurality of fuse boxes, each suitable for selectively outputting a first input signal and a reverse input signal obtained by inverting the first input signal; and
a first output signal generator suitable for performing a logical combination operation on the received input sig- nals from the plurality of fuse boxes, a second input signal and a third input signal to generate a first output signal;

a second output signal generator suitable for selectively receiving the first output signal, the second input signal, or a fourth input signal to generate a second output signal; and a second fuse box suitable for selectively outputting one of the second output signal and the second input signal to the first output signal generator.

2. The semiconductor integrated circuit of claim 1, further comprising:

a reverse signal generator suitable for generating the reverse input signal by inverting the first input signal.

3. The semiconductor integrated circuit of claim 1, wherein the second output signal generator selectively receives one of the first output signal, the second input signal, and the fourth input signal, inverts the received signal and outputs the inverted signal as the second output signal.

4. The semiconductor integrated circuit of claim 1, wherein the logic combination operation of the first output signal generator includes any one of an inverter operation, a NOR gate operation, a NAND gate operation, and a multiplexer operation on the first to third input signals.

5. The semiconductor integrated circuit of claim 1, wherein the first and second output signal generators perform a buffer operation, an OR operation, an AND operation, and a multiplexer operation on the first to third input signals.

6. A semiconductor integrated circuit comprising:

a plurality of fuse boxes, each suitable for selectively outputting a first input signal and a reverse input signal obtained by inverting the first input signal;

a first output signal generator suitable for performing a logical combination operation on the received input signals from the plurality of fuse boxes, a second input signal, and a third input signal to generate a first output signal;

a second output signal generator suitable for selectively receiving the first output signal, the second input signal, or a fourth input signal to generate a second output signal; and a second fuse box suitable for selectively outputting one of the second output signal and the second input signal to the first output signal generator, wherein the logical combination operation includes any one of an inverter operation, a buffer operation, a NOR gate operation, a NAND gate operation, an OR gate operation, an AND gate operation, and a multiplexer operation on the first to third input signals based on connections of the plurality of fuse boxes.

7. The semiconductor integrated circuit of claim 6, further comprising:

a reverse signal generator suitable for generating the reverse input signal by inverting the first input signal.

8. The semiconductor integrated circuit of claim 6, wherein the second output signal generator selectively receives one of the first output signal, the second input signal, and the fourth input signal, inverts the received signal, and outputs the inverted signal as the second output signal.

9. The semiconductor integrated circuit of claim 6, wherein the logical combination operation includes an inverter operation of inverting the second input signal or the third input signal.

10. The semiconductor integrated circuit of claim 6, wherein the logical combination operation includes a NOR gate operation on the first and second input signals in a state that the third input signal is set to a first logic level.

11. The semiconductor integrated circuit of claim 6, wherein the logical combination operation includes a NAND gate operation on the first and third input signals in a state that the second input signal is set to a second logic level.

* * * * *